US012671428B2

(12) United States Patent
Mafi et al.

(10) Patent No.: US 12,671,428 B2
(45) Date of Patent: Jun. 30, 2026

(54) SYSTEM AND METHOD FOR DIGITAL COMPENSATION OF TIMING SKEW MISMATCH IN TIME INTERLEAVED ANALOG TO DIGITAL CONVERTERS

(71) Applicant: CIENA CORPORATION, Hanover, MD (US)

(72) Inventors: Hamidreza Mafi, Montréal (CA); Sadok Aouini, Gatineau (CA); Naim Ben-Hamida, Ottawa (CA); Mohammad Honarparvar, Stittsville (CA); Yvon Savaria, Montréal (CA)

(73) Assignee: CIENA CORPORATION, Hanover, MD (US)

( * ) Notice: Subject to any disclaimer, the term of this patent is extended or adjusted under 35 U.S.C. 154(b) by 175 days.

(21) Appl. No.: 18/774,239

(22) Filed: Jul. 16, 2024

(65) Prior Publication Data

US 2026/0025144 A1     Jan. 22, 2026

(51) Int. Cl.
*H03M 1/10* (2006.01)
*H03M 1/06* (2006.01)
*H03M 1/12* (2006.01)

(52) U.S. Cl.
CPC ....... *H03M 1/1009* (2013.01); *H03M 1/0626* (2013.01); *H03M 1/1215* (2013.01)

(58) Field of Classification Search
CPC . H03M 1/1009; H03M 1/1215; H03M 1/0626
(Continued)

(56) References Cited

U.S. PATENT DOCUMENTS 8,421,656 B2 * 4/2013 Nishi .................. H03M 1/0626
                                                        370/545
9,806,732 B1 * 10/2017 Khoshgard ......... H03M 1/1038

OTHER PUBLICATIONS

Ali Khakpour, et al., "A New Fast Convergent Blind Timing Skew Error Correction Structure for TIADC", IEEE Transactions on Circuits and Systems—II: Express Briefs, vol. 68, No. 4, Apr. 2021, 5 pages.

(Continued)

*Primary Examiner* — Khai M Nguyen
(74) *Attorney, Agent, or Firm* — Guntin & Gust, PLC; Robert Gingher

(57)     ABSTRACT

Aspects of the subject disclosure may include, for example, a digital timing skew compensator, including: a first polyphase adaptive filter bank having a first input and a first output; a first input matrix coupled to the first input of the first polyphase adaptive filter bank; a first subtractor coupled to the first output of the first polyphase adaptive filter bank, wherein the first subtractor removes a first signal generated by the first polyphase adaptive filter bank from digital outputs of sub analog-to-digital converters (ADCs) of a time-interleaved ADC to create a desired signal, wherein the desired signal is coupled to the first input matrix; a modulation matrix that modulates the digital outputs of the sub-ADCs to create a modulated signal vector; a second polyphase adaptive filter bank having a second input and a second output; a second input matrix coupled to the second input of the second polyphase adaptive filter bank; and a second subtractor coupled to the second output of the second polyphase adaptive filter bank, wherein the second subtractor removes a second signal generated by the second polyphase adaptive filter bank from the modulated signal vector to create an error signal, wherein the error signal is coupled to the second input matrix. Other embodiments are disclosed.

20 Claims, 13 Drawing Sheets

100

(58) Field of Classification Search
USPC .......................................... 341/118, 126, 155
See application file for complete search history.

(56) References Cited

OTHER PUBLICATIONS

Li Yu, et al., "A Novel Adaptive Mismatch Cancellation System for Quadrature IF Radio Receivers", IEEE Transactions on Circuits and Systems—II: Analog and Digital Signal Processing, vol. 46, No. 6, Jun. 1999, 13 pages.

Patrick Satarzadeh, et al., "A Parametric Polyphase Domain Approach to Blind Calibration of Timing Mismatches for M-Channel Time-Interleaved ADCs", Proceedings of 2010 IEEE International Symposium on Circuits and Systems, 4 pages.

Christian Vogel, et al., "Adaptive Blind Compensation of Gain and Timing Mismatches in M-Channel Time-Interleaved ADCs", 2008 15th IEEE International Conference on Electronics, Circuits and Systems, 4 pages.

Junya Matsuno, et al., "All-Digital Background Calibration Technique for Time-Interleaved ADC Using Pseudo Aliasing Signal", IEEE Transactions on Circuits and Systems—I: Regular Papers, vol. 60, No. 5, May 2013, 9 pages.

Han Le Duc, et al., "All-Digital Calibration of Timing Skews for TIADCs Using the Polyphase Decomposition", IEEE Transactions on Circuits and Systems—II: Express Briefs, vol. 63, No. 1, Jan. 2016, 5 pages.

Hejir Rashidzadeh, et al., "Compensation of Transmitter I/Q Imbalance in Millimeter-Wave MIMO Systems Using a Single Transmitter Observation Receiver", IEEE Transactions on Microwave Theory and Techniques, vol. 68, No. 7, Jul. 2020, 10 pages.

Zhiyu Ru, et al., "Digitally Enhanced Software-Defined Radio Receiver Robust to Out-of-Band Interference", IEEE Journal of Solid-State Circuits, vol. 44, No. 12, Dec. 2009, 17 pages.

Ediz Cetin, et al., "On the structure, convergence and performance of an adaptive I/Q mismatch corrector.", Proceedings IEEE 56th Vehicular Technology Conference, Sep. 28, 2002, 6 pages.

Stefaan Van Gerven, et al., "Signal Separation by Symmetric Adaptive Decorrelation: Stability, Convergence, and Uniqueness", IEEE Transactions on Signal Processing, vol. 43, No. 7, Jul. 1995, 11 pages.

\* cited by examiner

100

200

201

210

211

MODULATING — 1301

GENERATING — 1302

REMOVING — 1303

MODIFYING — 1304

1300

SYSTEM AND METHOD FOR DIGITAL COMPENSATION OF TIMING SKEW MISMATCH IN TIME INTERLEAVED ANALOG TO DIGITAL CONVERTERS

FIELD OF THE DISCLOSURE

The subject disclosure relates to a system and method for digital compensation of timing skew mismatch in time interleaved analog to digital converters.

BACKGROUND

Time-Interleaved Analog-to-Digital Converters (TIADCs) are a type of analog-to-digital converter (ADC) that use a technique called time interleaving to process regular sample data series at a faster rate than the operating sample rate of each individual data converter. In a TIADC system, an array of multiple identical ADCs operates in a round-robin manner, which enables a higher sampling rate. This is a very effective technique, as there is a fundamental limit to the maximum sampling speed with a single channel, but the process can be technology dependent.

The principle of time interleaving consists of time multiplexing a parallel array of identical ADCs to achieve a higher net sample rate, even though each ADC in the array is actually sampling (and converting) at a lower rate. For example, by interleaving four 10-bit/100 megabits/second (MSPS) ADCs, one could in principle realize a 10-bit/400 MSPS ADC.

However, this powerful technique is not free of practical challenges. Timing skew is a significant issue in TIADCs. Timing skew refers to the timing mismatches that occur when the individual ADCs in the TIADC array do not sample at exactly the right time. Timing skew can greatly degrade the overall performance of the TIADC. Errors caused by timing skews are dependent on the input content and are proportional to the frequency of input signals. This means that as the frequency of the input signals increases, the effect of the same timing mismatches on the system's performance also increases. Timing skew errors become a primary concern in high-speed TIADCs. In practical terms, timing skew can lead to undesirable errors and degrade the overall performance of the system. These skew-induced errors are often referred to as "interleaving spurs" or "IL spurs" and can be seen when the data streams coming from the channels are digitally assembled together to reconstruct the original input signal.

To mitigate the effects of timing skew, various calibration techniques have been developed. These techniques aim to detect the sampling time mismatches in the TIADC by estimating the skew-related errors with a reference channel and aligning the sampling edge of each sub-ADC to that of the reference channel. However, these calibration techniques can be complex and may require additional hardware. In summary, while TIADCs offer the advantage of higher sampling rates, timing skew presents a significant challenge that needs to be carefully managed to ensure optimal performance.

BRIEF DESCRIPTION OF THE DRAWINGS

Reference will now be made to the accompanying drawings, which are not necessarily drawn to scale, and wherein.

DETAILED DESCRIPTION

Figure 1:
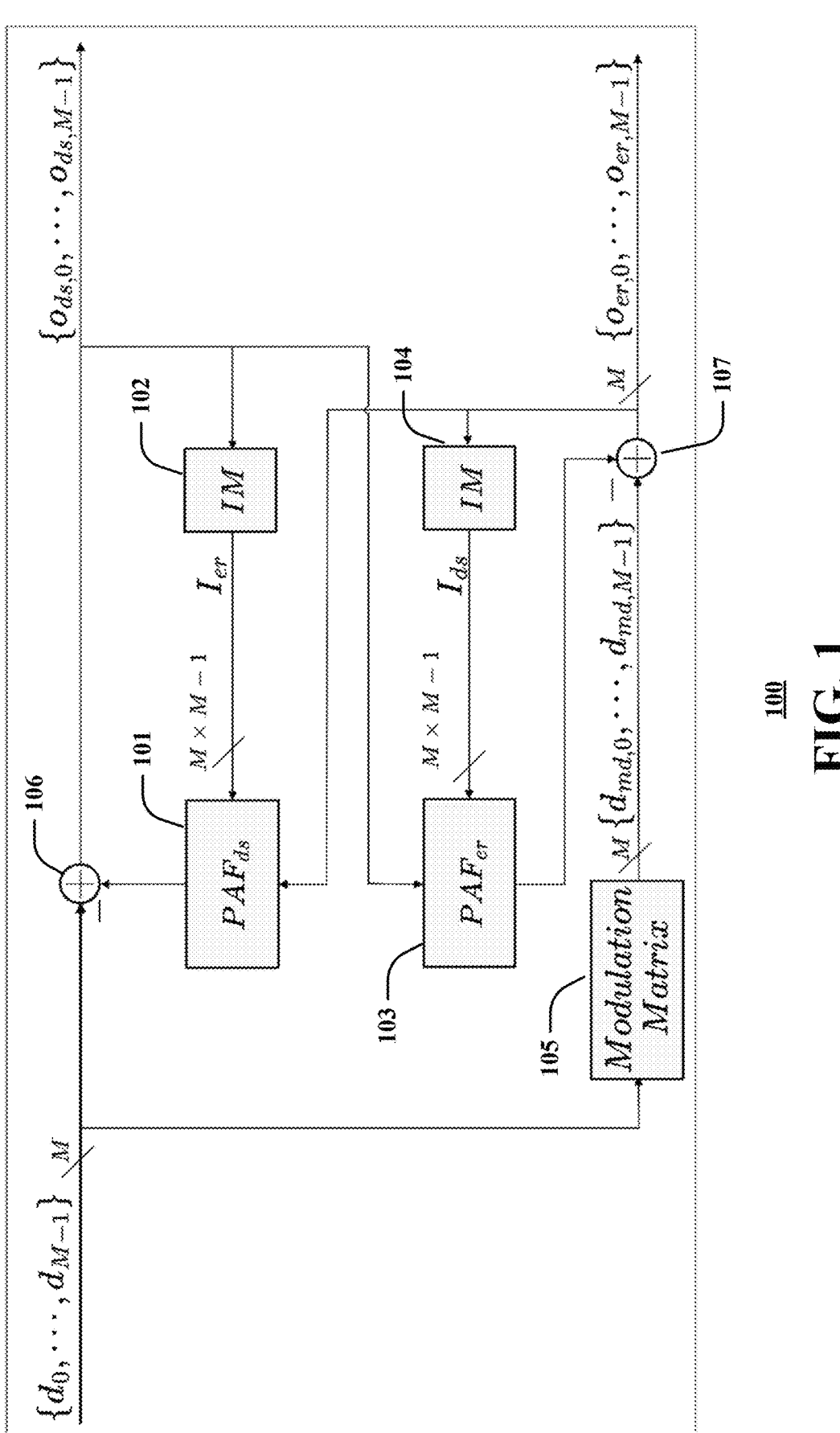
FIG. 1 is a block diagram illustrating an exemplary, non-limiting embodiment of a system to digitally compensate for timing skew errors in a time-interleaved analog to digital converter in accordance with various aspects described herein.

The subject disclosure describes, among other things, illustrative embodiments for incorporating adaptive polyphase filters to digitally compensate for timing skew mismatch in time interleaved analog to digital converters. In more detail, the proposed technology uses a source separation algorithm and a modulation matrix as a second combination for the source separation algorithm to remove errors in the TIADC digital output. Further, the proposed technology implements the source separation algorithm using a polyphase approach to relieve the speed requirement. The system is capable of directly operating on the sub-ADC outputs. Other embodiments are described in the subject disclosure.

One or more aspects of the subject disclosure include a digital timing skew compensator, including: a first polyphase adaptive filter bank having a first input and a first output; a first input matrix coupled to the first input of the first polyphase adaptive filter bank; a first subtractor coupled to the first output of the first polyphase adaptive filter bank, wherein the first subtractor removes a first signal generated by the first polyphase adaptive filter bank from digital outputs of sub analog-to-digital converters (ADCs) of a time-interleaved ADC to create a desired signal, wherein the desired signal is coupled to the first input matrix; a modulation matrix that modulates the digital outputs of the sub-ADCs to create a modulated signal vector; a second polyphase adaptive filter bank having a second input and a second output; a second input matrix coupled to the second input of the second polyphase adaptive filter bank; and a second subtractor coupled to the second output of the second polyphase adaptive filter bank, wherein the second subtractor removes a second signal generated by the second polyphase adaptive filter bank from the modulated signal vector to create an error signal, wherein the error signal is coupled to the second input matrix.

One or more aspects of the subject disclosure include a digital timing skew compensator, having: an adaptive filter bank having a first input and a first output; a first subtractor coupled to the first output of the adaptive filter bank, wherein the first subtractor removes a reconstructed error component generated by the adaptive filter bank from a digital output of a time-interleaved analog-to-digital converter (ADC) to create a compensated signal; and a modulator that modulates the compensated signal to create a modulated signal vector, wherein the modulated signal vector is coupled to the first input of the adaptive filter bank.

One or more aspects of the subject disclosure include a digital timing skew compensator, including: an input to receive a digital signal from either a time-interleaved analog-to-digital converter (ADC) or a plurality of sub-ADCs, wherein the time-interleaved ADC comprises the plurality of sub-ADCs; a first output to provide a compensated digital signal; a feedback path between the first output and the input having an adaptive filter bank disposed in the feedback path; and a subtractor that removes a second output of the adaptive filter bank from the input to generate the compensated digital signal.

FIG. 1 is a block diagram illustrating an exemplary, non-limiting embodiment of a system to digitally compensate for timing skew errors in a time-interleaved analog to digital converter in accordance with various aspects described herein. As shown in FIG. 1, system 100 comprises a first polyphase adaptive filter bank (PAF 101) coupled to a first input matrix (IM 102), a second polyphase adaptive filter bank (PAF 103) coupled to a second input matrix (IM 104), and a modulation matrix 105. As illustrated in FIG. 1, system 100 uses a first subtractor 106 to ideally remove the error signal created by the timing skew, as represented by $\{o_{er,0}, o_{er,1} \ldots o_{re,M-1}\}$ from the output of the TIADC, as represented by $\{d_0, d_1 \ldots d_{M-1}\}$, resulting in the desired output of the TIADC, i.e., without any timing skew error, as represented by $\{o_{ds,0}, o_{ds,1} \ldots o_{ds,M-1}\}$. System 100 uses a decorrelation principle to separate and categorize ideal samples of the input signal and an error element arising from the timing-skew mismatch in the outputs of the M sub- ADCs of the TIADC (not shown). The decorrelation mechanism highly desensitizes system 100 to the frequency of the TIADC.

System 100 uses modulation matrix 105 to create a modulated signal vector, represented by $\{d_{md,0}, d_{md,1} \ldots d_{md,M-1}\}$, from the outputs of the sub-ADCs to adapt and use in the source separation algorithm. The modulated signal vector is provided to a second subtractor 107 that removes the output of PAF 103 to create the error signal. In general, this modulation operation can be realized by processing the complex signals by complex frequency shift operations. However, in an embodiment, modulation matrix 105 comprises a Hadamard transform to avoid operating with complex signals. In this approach, each modulating signal corresponds to a row of a Hadamard matrix of order M. Unlike prior art digital timing skew error correction methods, PAF 101, PAF 103 and modulation matrix 105 are incorporated into the feedback loops. As apparent from a visual inspection of FIG. 1, subtractor 106 of system 100 does not introduce any timing delay between the output of the sub-ADCs and creation of the desired output.

System 100 implements two banks of polyphase filters PAF 101 and PAF 103 to purify the desired output and error signal, respectively. The polyphase filter PAF 101 aims to remove the error terms for retrieving the desired vector signal, $O_{ds}$. On the other hand, the polyphase filter PAF 103 purifies the error output $O_{er}$ from the desired output. As shown in FIG. 1, input matrix 102 creates input metric $I_{er}$ from the desired output. Likewise, input matrix 104 creates input metric $I_{ds}$ from the error signal. Both input metrics comprise matrices of size M×M−1, as shown in FIG. 1.

Mathematically, outputs of each polyphase filter bank, in the frequency domain, are given by:

$$O(z) = IM(z) \times AF(z)$$

where the vector AF(z) and the matrix IM(z) represent the polyphase components and the input metric, respectively. The input matrix is also expressed as $$IM(z) = \begin{bmatrix} D_{i,0}(z) & z^{-1}D_{i,M-1}(z) & \ldots & z^{-1}D_{i,1}(z) \\ D_{i,1}(z) & D_{i,0}(z) & \ldots & z^{-1}D_{i,2}(z) \\ \vdots & \vdots & \ddots & \vdots \\ D_{i,M-1}(z) & D_{i,M-2}(z) & \ldots & D_{i,0}(z) \end{bmatrix}$$

where $D_{i,r}$ r=0, ..., M−1 are the input of the matrix IM(z). The two replicas of matrix IM provide the input two the PAF filters. Each PAF consists of M adaptive filters. Inside each PAF, the multiplication product of each row of the matrix IM(z) and the vector AF(z) specifies one of the M adaptive filters, as set forth in more detail below. Mathematically, the outputs associated with PAF 101 and PAF 103, in the frequency domain, can be expressed as follows:

$$O_{ds}(z) = D(z) - I_{er}(z) \times AF_{ds}(z),$$

$$O_{er}(z) = D_{md}(z) - I_{ds}(z) \times AF_{er}(z),$$

where $AF_{ds}$ and $AF_{er}$ respectively denote the polyphase decomposition vector of filters PAF 101 and PAF 103, and also, $I_{er}$ and $I_{ds}$ respectively represent the outputs of the input matrices IM 102 and IM 104 associated with $O_{er}$ and $O_{ds}$, in the frequency domain. The proposed technique targets decorrelating its desired output vector, $O_{ds}$, and the error output vector, $O_{er}$. In reference to the single-rate technique, the modulation matrix of order M creates the modulated vector, $D_{md}$ by modulating the vector D consisting of the outputs of sub-ADCs.

Figure 2:
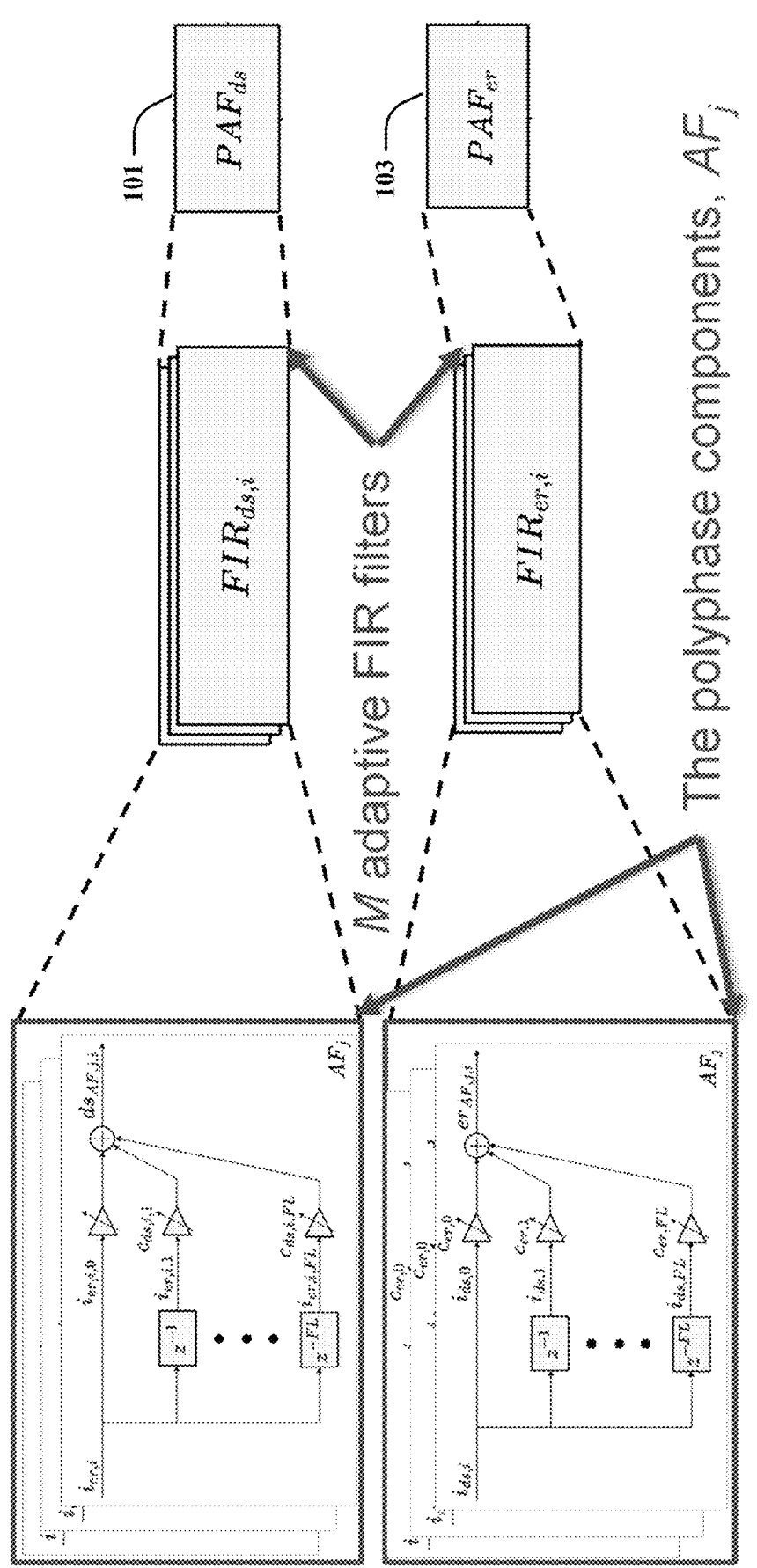
FIG. 2 is a block diagram illustrating an exemplary, non-limiting embodiment of polyphase adaptive filters used in a system to digitally compensate for timing skew errors in a time-interleaved analog to digital converter in accordance with various aspects described herein.

FIG. 2 is a block diagram illustrating an exemplary, non-limiting embodiment of polyphase adaptive filters used in a system to digitally compensate for timing skew errors in a time-interleaved analog to digital converter in accordance with various aspects described herein. As shown in FIG. 2, PAF 101 and PAF 103 comprise M adaptive finite impulse response (FIR) filters. Each FIR filter consists of all the polyphase components, $AF_j$, where j=0, ..., M−1, but their order in each FIR filter is different. For example, the component $AF_1$ obtains $D_{M-1}$ as its input in the first FIR filter, while it receives $D_0$ as its input in the second FIR filter. Mathematically, each of the two polyphase filters can each be represented by its polyphase decomposition as a vector:

$$AFIR(z) = \sum_{j=0}^{M-1} z^{-j} AF_j\left(z^M\right)$$

where $AF_j$ denotes the $j^{th}$ polyphase component. The polyphase implementation requires the polyphase components to create M FIR filters that separately operate on the outputs of the sub-ADCs.

Figure 3:
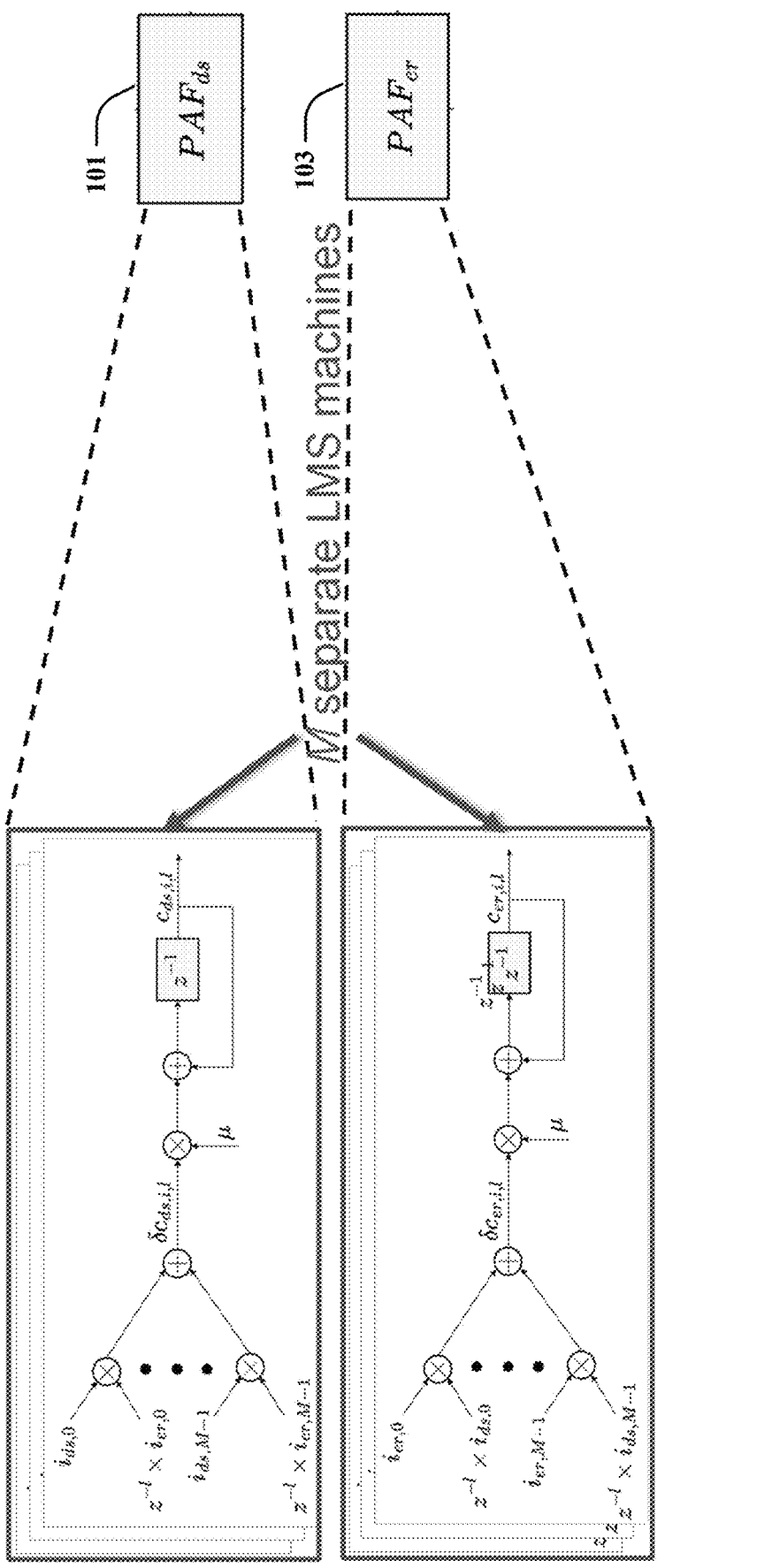
FIG. 3 is a block diagram illustrating an exemplary, non-limiting embodiment of least-mean squared circuits used to create coefficients for tuning polyphase filters in a system to digitally compensate for timing skew errors in a time-interleaved analog to digital converter in accordance with various aspects described herein.

FIG. 3 is a block diagram illustrating an exemplary, non-limiting embodiment of least-mean squared circuits used to create coefficients for tuning polyphase filters in a system to digitally compensate for timing skew errors in a time-interleaved analog to digital converter in accordance with various aspects described herein. The polyphase realization of the source separation algorithm treats the adjustments of the processing errors, when tuning the filters PAF 101 and PAF 103, as leakages of an error element in the desired output $\{o_{ds,0}, o_{ds,1} \cdots o_{ds,M-1}\}$ and leakages of an desired element in the error signal $\{o_{er,0}, o_{er,1} \cdots o_{re,M-1}\}$. For each of the filters PAF 101 and PAF 103, energy signals corresponding to the $j^{th}$ polyphase components are defined as:

$$\xi_{ds,AF_j} = \sum_{i=0}^{M-1} E\left(ds_{AF_{j,i}}^2\right),$$

$$\xi_{er,AF_j} = \sum_{i=0}^{M-1} E\left(er_{AF_{j,i}}^2\right),$$

where j=0, ..., M−1, and $ds_{AF_{j,i}}$ and $er_{AF_{j,i}}$ respectively stand for the outputs of the $j^{th}$ polyphase component receiving their $i^{th}$ inputs $i_{er,i}$ and $i_{ds,i}$ from the input metric.

As shown in FIG. 3, the source separation approach can use M least-mean-squared (LMS) circuits to separately minimize these energy signals. The LMS circuits tune the coefficients of the polyphase components, $AF_j$, for both the polyphase filters. For this reason, gradual adjustment of the coefficients of $AF_j$ needs to process all the sub-ADC outputs concurrently. The proposed approach separately tunes the polyphase decomposition, $AF_j$. Each component participates in all the M FIR filters receiving M different inputs (i.e., the outputs of the input metric). For this reason, all the inputs and outputs of the polyphase decompositions must contribute to the iterative tuning of their weights. According to the LMS algorithm, the update steps of the coefficients are defined as:

$$\delta c_{ds,j,l}(n) = \sum_{i=0}^{M-1} i_{ds,i}(n) \times i_{er,i}(n-l),$$

$$\delta c_{er,j,l}(n) = \sum_{i=0}^{M-1} i_{er,i}(n) \times i_{ds,i}(n-l).$$

The update equations that adjust the coefficients of the polyphase FIR filters are given by:

$$c_{ds,j,l}(n+1) = c_{ds,j,l}(n) + \mu \times \delta c_{ds,j,l},$$

$$c_{er,j,l}(n+1) = c_{er,j,l}(n) + \mu \times \delta c_{er,j,l},$$

where j=0 ... M−1, and l=1 ... FL, where FL is the number of filter taps in each adaptive FIR filter. The parameter $\mu$ must be selected carefully to stabilize the polyphase filters. A suitable selection of the parameter $\mu$ guarantees the stability of the AFIR filters. The stability margin improves as $\mu$ reduces at the expense of a reduced convergence rate of the proposed technique. The orthogonality between the outputs contributes to the convergence of the filters. The factor $\mu$ must be selected carefully according to the number of taps and the required convergence rate to ensure rapid and stable convergence. In the polyphase implementation, the bank of M FIR filters operates at $1/M^{th}$ of the single-rate FIR filter and does not increase the power dissipation. Furthermore, the impact of the number of sub-ADCs and/or the bandwidth of the input signal on the proposed method is notable, as PAF 101 and PAF 103 with more taps must be used as these two parameters increase. Accordingly, the bandwidth requirements and the number of sub-ADCs determine the optimum number of taps for the PAFs.

Using MATLAB/Simulink and Vivado Design Suite, several simulations of target field-programmable gate array (FPGA) implementations were performed to verify and validate the disclosed compensation method. In all the following simulations, a behavioral TIADC model in Simulink is used. This model consists of four identical 12-bit sub-ADCs, for simplicity, the sampling rate, $F_s$, of the TIADC is normalized to one, and the standard deviation of the timing-skew mismatch is set to 0.1 (i.e., 10% of the TIADC sampling period). Proper convergence of the proposed compensation technique relies on a maximum of $2^{-12}$ for the update step factor, $\mu$. The size of the polyphase filters, FL, was set to 15. In these simulations, fast Fourier transforms (FFTs) of length $N_{fft}$ are utilized to measure and evaluate the performance. Also, signals of length $N_{fft}$ are employed as the input signal of the TIADC to prevent spectral leakage. The frequency selected for the input tones, $f_{in}$, is of interest as it translates to the bin index $I_{bin}$ in the FFT outputs with a value of $F_s \times I_{bin}/N_{fft}$. In the following simulations, the bin index $I_{bin}$ is referred to as an alternate for the frequency of the input tones. The values selected for $I_{bin}$ were prime numbers to make the TIADC quantization errors spectrum uniform (by avoiding repetitive patterns in the input tone(s)). $N_{fft}$ is set to $2^{B+1}$ (i.e., $=2^{13}$).

The simulations begin by evaluating the word width impact on method performance to select the optimum width in terms of the signal-to-noise-and-distortion ratio (SNDR) and hardware cost. In this part, a fixed-point Simulink model of the proposed method was used, and a single-tone sine wave with its corresponding $I_{bin}$ was applied as the input signal. For each word width, 563 simulation runs were performed by sequentially selecting prime numbers in the range $\{1, \ldots, N_{fft}/2\}$ for the bin $I_{bin}$, and these SNDR outcomes are gathered to obtain the mean of SNDRs. Table I provides the results of this part of the simulation with different word widths:

TABLE I

| IMPACT OF WORD WIDTH | | | | | |
|---|---|---|---|---|---|
| Word Width (bits) | 14 | 15 | 16 | 17 | 18 |
| Mean$_{SNDR}$ (dB) | 60.31 | 63.70 | 65.38 | 65.91 | 66.02 |
| $\sigma_{SNDR}$ (dB) | 12.49 | 13.76 | 14.49 | 14.68 | 10.08 |

The proposed method's fixed-point version of the Simulink model was implemented on FPGA to validate its synthesizability and the hardware cost for each word width. The FPGA implementations target the Xilinx Virtex-7 VX690T realized on 28-nm technology. The Virtex-7 VX690T series from Xilinx comprises 2800 DSP slices and 485k logic cells. First, the Simulink fixed-point model of our method is converted to Verilog HDL codes with the Simulink HDL Coder. These codes are then synthesized and implemented on FPGA by the MATLAB FIL Wizard and the Vivado Design Suite. The transfer rate via the JTAG protocol for communicating is 12.5 MHz. Table II provides the hardware cost of FPGA implementation for various word widths:

TABLE II

| HARDWARE COST | | | | | |
|---|---|---|---|---|---|
| Word Width (bits) | 14 | 15 | 16 | 17 | 18 |
| Lookup Tables (%) | 6.88 | 6.41 | 6.6 | 15.05 | 21.81 |
| Flip Flops (%) | 0.92 | 0.95 | 0.98 | 1.18 | 1.31 |
| DSP Slices (%) | 28.89 | 28.89 | 28.89 | 28.89 | 28.89 |

This table shows that the SNDR mean enhances as the word width expands from 14 to 16 bits. Nevertheless, the improvement beyond 16 bits is negligible. The absence of results for word widths lower than 14 bits is worth mentioning in Table I as the proposed method failed to converge for such word widths. As shown in Table II, the hardware and power consumption costs expand with growing word width. Thus, a 16-bit word width is selected as the best compromise between a good SNDR and an acceptable hardware cost.

The following simulations depict the convergence of the PAFs and also the PSD of the digital output, $d_{tiadc}$, the desired output and the error signal. For these simulations, a single-tone and 4-tone sine-wave inputs are applied to the TIADC. This part of the simulation utilizes the TIADC, modeled in Simulink with floating point precision, together with both the proposed method's FPGA implementation and the fixed-point Simulink model.

Figures 4A, 4B, 4C:
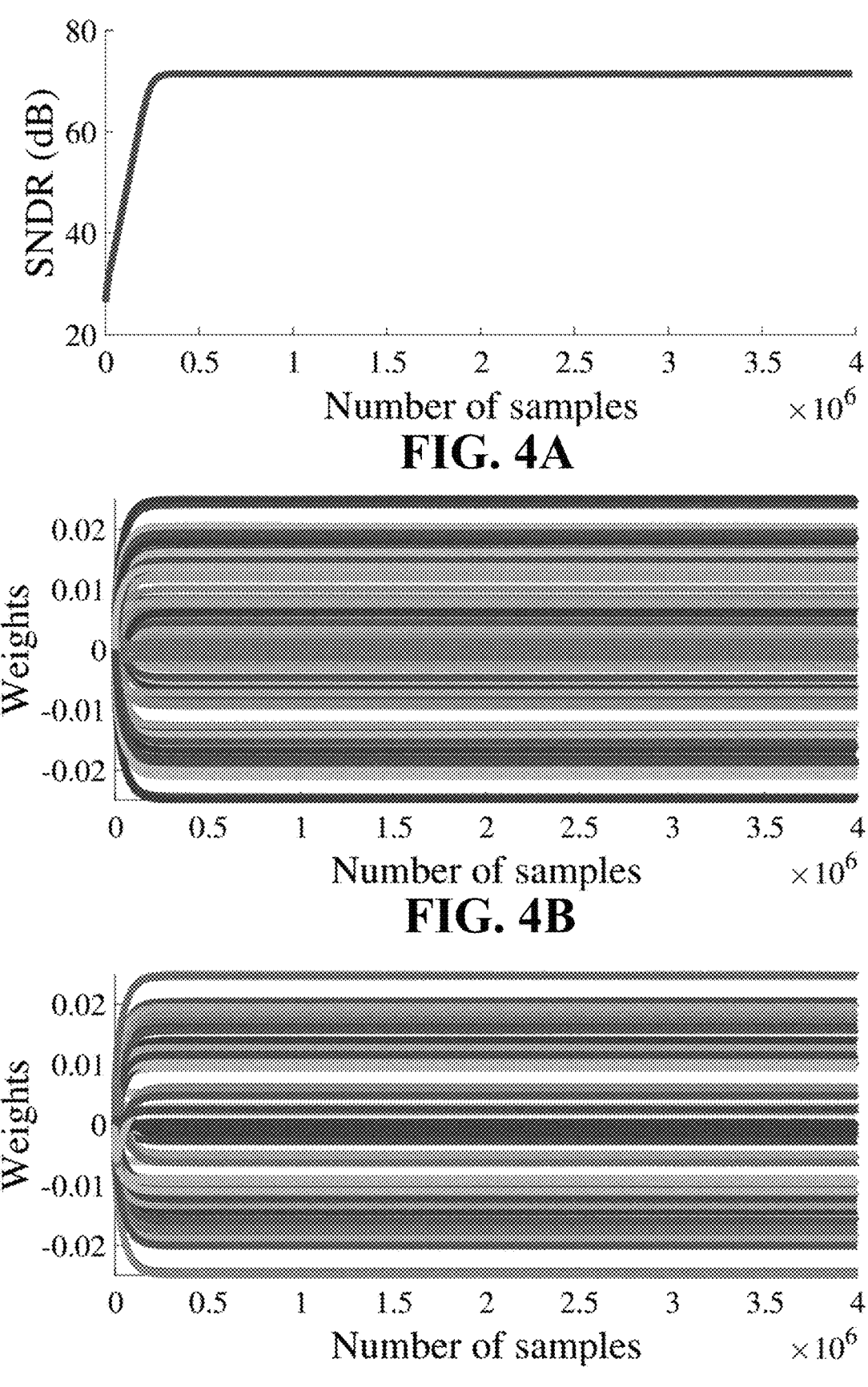
FIGS. 4A, 4B and 4C are graphs that illustrate the convergence performance of the system when introduced to a single-tone sine wave.

FIGS. 4A, 4B and 4C are graphs that illustrate the convergence performance of the system when introduced to a single-tone sine wave. In this simulation, a single-tone sine wave having a corresponding bin index $I_{bin}=2781$ is applied to the TIADC as the input signal. FIG. 4A illustrates the convergence of SNDR. The proposed approach enhances the SNDR from 22.57 dB to more than 71.51 dB. FIGS. 4B and 4C illustrate the convergence of weights in PAF 101 and PAF 103, respectively. The method converges with approximately $3\times10^5$ samples and remains stable after convergence. As evident from FIGS. 4A, 4B and 4C, the results of the fixed-point Simulink model and the FPGA implementation of the proposed method entirely match validating the synthesizability of the Simulink model with fixed point precision.

Figure 5A:
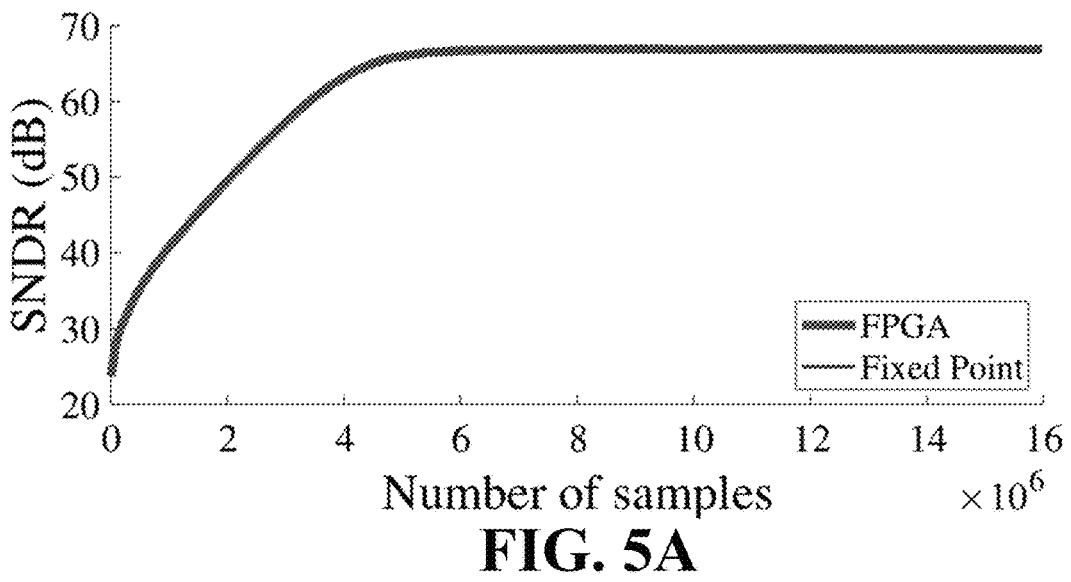
FIGS. 5A, 5B and 5C are graphs that illustrate the convergence performance of the system when introduced to a 4-tone sine wave.
Figure 5B:
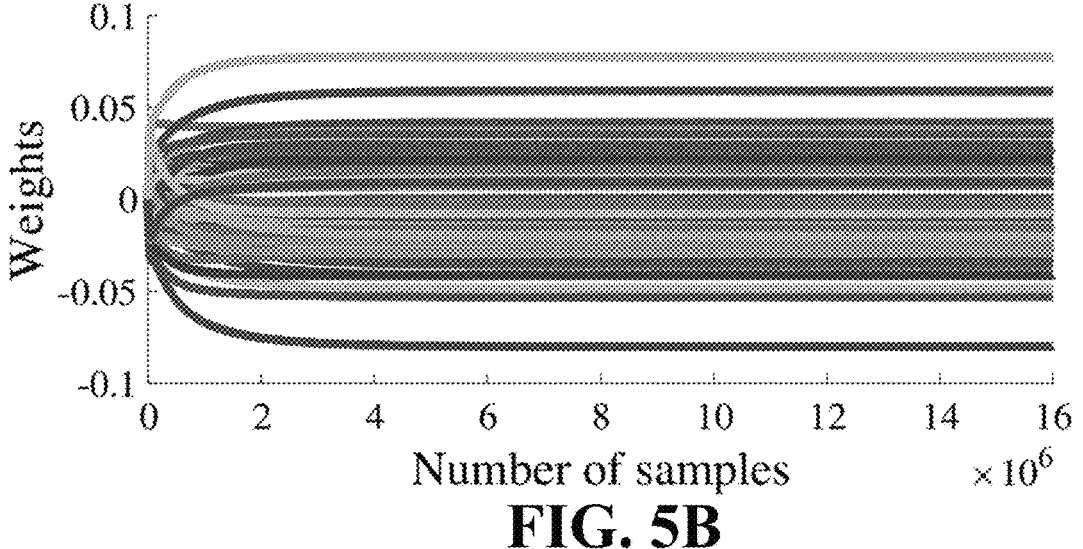
Figure 5C:
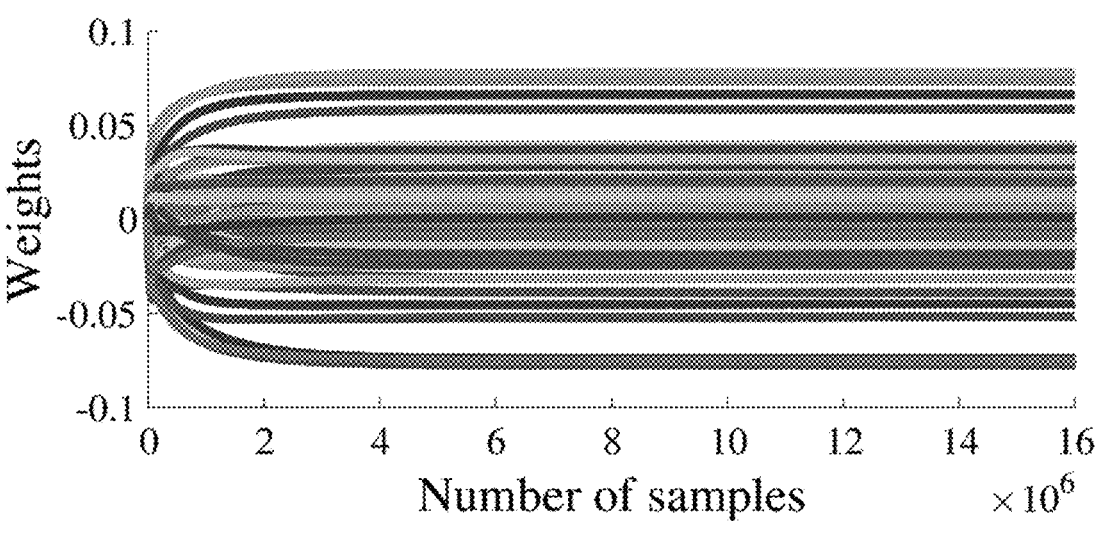

FIGS. 5A, 5B and 5C are graphs that illustrate the convergence performance of the system when introduced to a 4-tone sine wave. In this simulation, a 4-tone sine wave having corresponding bins Ibin=$\{530, 902, 1274, 1647\}$ is applied to the TIADC modeled in Simulink, together with the FPGA implementation and the fixed-point Simulink model of the proposed method. FIG. 5A indicates the proposed approach enhances the SNDR from 24.11 dB to 66.92 dB. FIGS. 5B and 5C illustrate the convergence of weights in PAF 101 and PAF 103, respectively. The method converges after utilizing approximately $5\times10^6$ samples. As evident from FIGS. 5A, 5B and 5C, the results of the fixed-point Simulink model and the FPGA implementation of the proposed method entirely match again validating the synthesizability of the Simulink model as a fixed-point precision implementation.

The proposed technique can be used with the entire Nyquist range of the input frequency. However, the embodiment that uses the Hadamard transform is restricted to a special number of channels. Further, the proposed technique does not require extra sub-ADC(s) in contrast to prior art methods and provides a better SNDR than other prior art techniques that do not require extra sub-ADCs, which necessarily modifies the architecture of the TIADC, whereas the proposed method does not. In summary, the proposed method appears to be the best choice for target applications in which the whole Nyquist range is used without modifying the TIADC architecture.

Even though the behavioral simulations were performed assuming an FPGA target implementation, the results easily transpose to application specific integrated circuit (ASIC) platforms as the proposed method is fully digital and operates independently from the architecture and circuit design of TIADC. As reported earlier, the proposed digital compensation method can be implemented on FPGA to operate on real-time data faster than a conventional processor could do. The resulting implementation costs are reported in Table II. In addition, since timing skews are expected to vary slowly with time (e.g., due to temperature drifts), the coefficients needed for the proposed method can be discovered using an LMS built-in Software/Firmware. Most state-of-the-art TIADCs have built-in memory for testing and calibration; hence, the proposed polyphase source separation method can take advantage of these memories without additional hardware costs. Furthermore, the proposed technique can be fully synthesized offline in software, not one real-time traffic (e.g., test applications).

Figure 6:
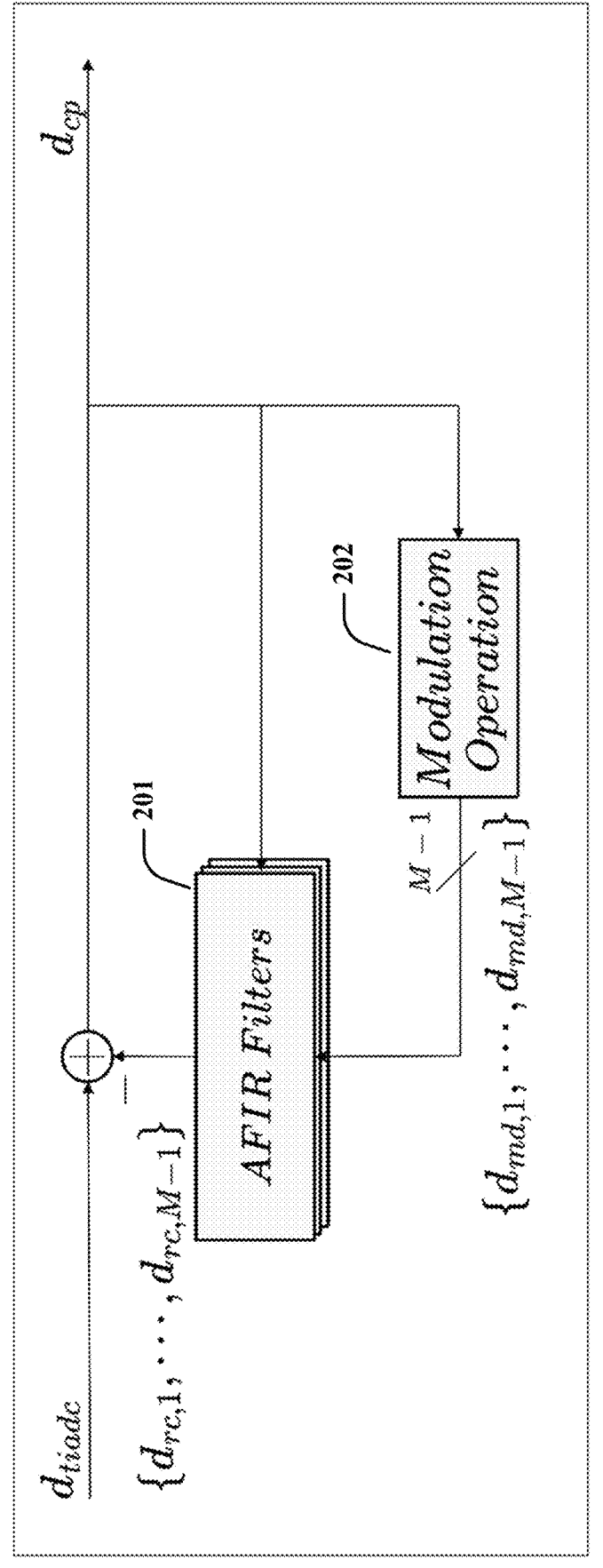
FIG. 6 is a block diagram illustrating an exemplary, non-limiting embodiment of adaptive FIR filters used in a system to digitally compensate for timing skew errors in a time-interleaved analog to digital converter in accordance with various aspects described herein.

FIG. 6 is a block diagram illustrating an exemplary, non-limiting embodiment of adaptive FIR filters used in a system to digitally compensate for timing skew errors in a time-interleaved analog to digital converter in accordance with various aspects described herein. As shown in FIG. 6, system 200 comprises an adaptive FIR filter bank (AFIRs 201) and a modulator 202. System 200 iteratively reconstructs an error component arising from timing-skew mismatch using AFIRs 201 together with modulator 202. As shown in FIG. 6, system 200 generates a compensated digital output, $d_{cp}$, by removing the reconstructed error component $\{d_{rc,1}, \ldots d_{rc,M-1}\}$ from the TIADC digital output, $d_{tiadc}$. Mathematically, this operation can be expressed in the frequency domain as:

$$D_{cp}(z) = D_{tiadc}(z) - D_{rc}(z).$$

where $D_{rc}(z)$ represents the error component in the frequency domain. The error component is generated by a set of M−1 adaptive FIR filters (AFIRs 201) from the output $\{d_{md,1}, \ldots d_{md,M-1}\}$ of modulator 202. Modulator 202 provides a coarse estimate of terms in the error component by modulating the compensated digital signal, $d_{cp}$. In an embodiment, modulator 202 comprises a Hadamard transform.

Mathematically, AFIRs 201 generate the error component, as expressed in the frequency domain by:

$$D_{rc}(z) = \sum_{i=1}^{M-1} AFIR_i(z) \times D_{md,i}(z).$$

where M is the number of sub-ADCs and $D_{md,i}(z)$ represents the $i^{th}$ component of the output of modulator 202 in the frequency domain. The M−1 adaptive FIR filters are tuned such that the compensated digital signal, $d_{cp}$, becomes uncorrelated to the reconstructed error component as set forth in more detail below.

Figure 7:
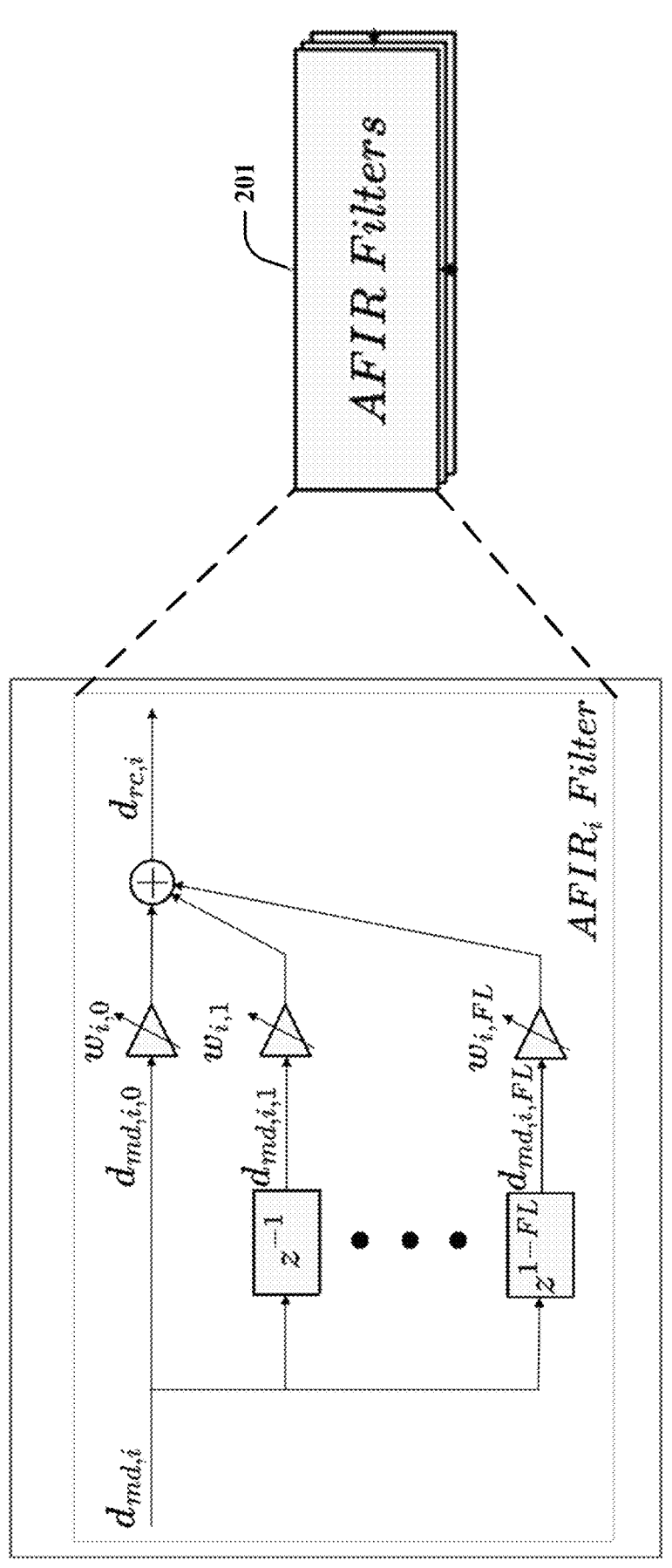
FIG. 7 is a block diagram illustrating an exemplary, non-limiting embodiment of an instance of an adaptive FIR filter used in a system to digitally compensate for timing skew errors in a time-interleaved analog to digital converter in accordance with various aspects described herein.

FIG. 7 is a block diagram illustrating an exemplary, non-limiting embodiment of an instance of an adaptive FIR filter used in a system to digitally compensate for timing skew errors in a time-interleaved analog to digital converter in accordance with various aspects described herein. As shown in FIG. 7, each of the M−1 filters in AFIRs 201 is a standard FIR filter comprising weights $\{w_{i,0} \ldots w_{i,FL}\}$, where FL is the number of taps in each FIR filter. The weights of the AFIR filters can be adjusted to values that minimize the energy signal defined by:

$$\xi_{cp} = E(d_{cp}^2).$$

By minimizing this energy signal, the system mitigates the error components in the compensated signal, $d_{cp}$. Minimizing the energy signal also ensures orthogonality between the compensated signal, $d_{cp}$, and the error components. In an embodiment, AFIRs 201 uses a least mean squares (LMS) machine to minimize the energy signal.

In the LMS algorithm, the derivatives of the energy signal direct the AFIR filters to the minimum of the energy signal. These derivatives for each coefficient, called the update steps, could be expressed as $$\delta w_{i,l} = \frac{d\xi_{cp}}{dw_{i,l}}$$

where $l=1, \ldots, FL$, and $w_{i,l}$ denotes the weights of the $i^{th}$ filter AFIR$_i$, while FL represents the number of taps of these AFIR filters. The update steps can be expressed as:

$$\delta w_{i,l}(n) = d_{md,i}(n-l) \times d_{cp}(n)$$

where n denotes the discrete-time index (corresponding to the operating frequency of Fs). In the LMS algorithm, the update expressions could be given by $$w_{i,l}(n+1) = w_{i,l}(n) + \mu \times \delta w_{i,l}(n)$$

where $l=1, \ldots, FL$, while the factor $\mu$ represents the update rate.

Figure 8:
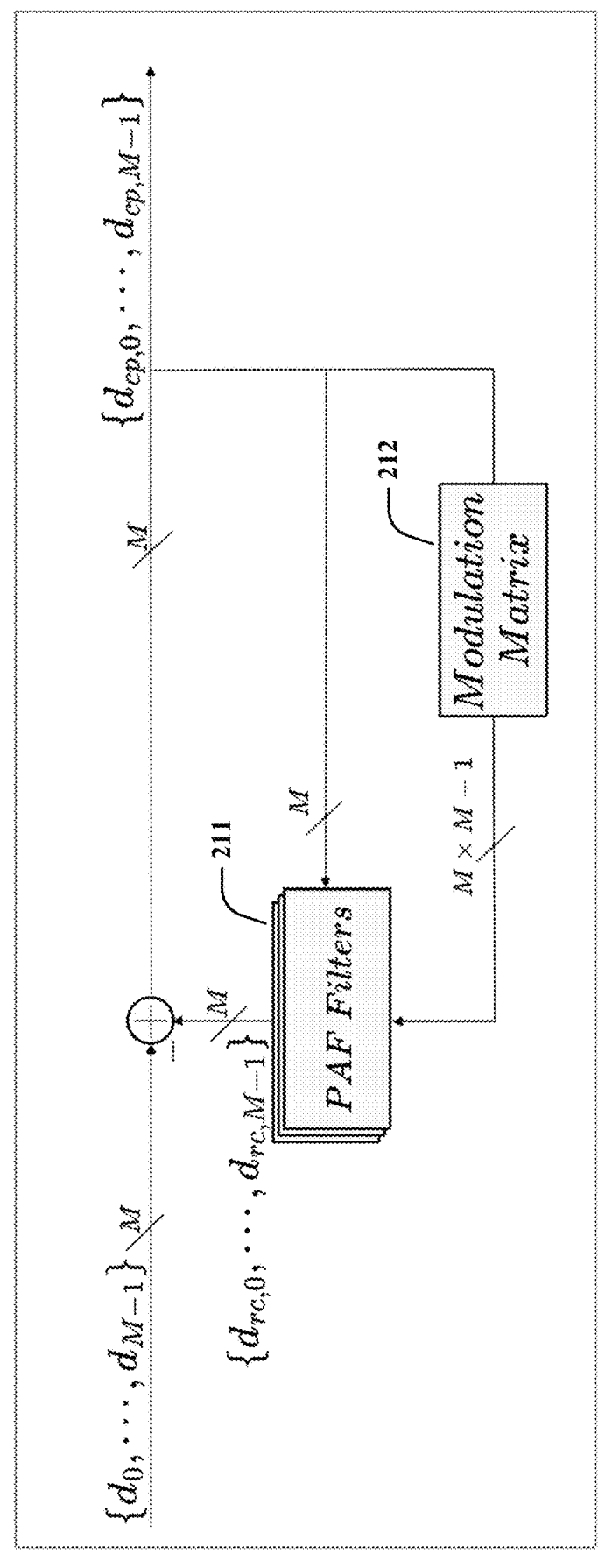
FIG. 8 is a block diagram illustrating an exemplary, non-limiting embodiment of adaptive polyphase filters used in a system to digitally compensate for timing skew errors in a time-interleaved analog to digital converter in accordance with various aspects described herein.

FIG. 8 is a block diagram illustrating an exemplary, non-limiting embodiment of adaptive polyphase filters used in a system to digitally compensate for timing skew errors in a time-interleaved analog to digital converter in accordance with various aspects described herein. As shown in FIG. 8, system 210 comprises a bank of M−1 polyphase adaptive filters (PAF 211) and a modulator 212. By using a polyphase approach, system 210 causes a significant reduction in the operation speed to $F_s/M$ since the polyphase format directly operates on the outputs of sub-ADCs. As shown in FIG. 8, a set of compensated signals $\{d_{cp,0}, \ldots, d_{cp,M-1}\}$, are applied to PAF 211, which creates a set of reconstructed error signals $\{d_{rc,0}, \ldots, d_{rc,M-1}\}$ from modulated signals. In an embodiment, modulator 212 is implemented by a Hadamard transform, which results in efficient hardware implementations. The modulated signals have all the M−1 images.

Mathematically, the compensated vector signal $D_{cp}$ is defined in the frequency domain as:

$$D_{cp}(z) = D(z) - D_{rc}(z).$$

where $D_{cp}$ consists of the signals $\{d_{cp,0}, \ldots, d_{cp,M-1}\}$ that are applied to PAF 211 as inputs while $D_{rc}$ is the outputs of the polyphase filter banks of PAF 211, representing the reconstructed error signal. The polyphase realization needs these polyphase elements to assemble different M FIR filters in a PAF filter, which individually process the outputs of the Sub-ADCs. Similar to the single-rate format mentioned above, the outputs of the polyphase filter banks, which represent the reconstructed error signal, are mathematically expressed in the frequency domain as:

$$D_{rc}(z) = \sum_{i=1}^{M-1} IM_i(z) \times PE_i(z)$$

where $D_{rc}$ consists of $\{d_{rc,0}, \ldots, d_{rc,M-1}\}$, while the vector $PE_i$ and the matrix $IM_i$ respectively denote the $i^{th}$ polyphase vector and input matrix $i=1, \ldots, M$ of the $i^{th}$ polyphase filter. The vector $PE_i$ and the matrix $IM_i$ defined as:

$$PE_i(z) = \begin{bmatrix} PE_{i,0}(z) \\ \vdots \\ PE_{i,M-1}(z) \end{bmatrix}$$

-continued $$IM_i(z) = \begin{bmatrix} D_{md,i,0} & z^{-1}D_{md,i,M-1} & \cdots & z^{-1}D_{md,i,1} \\ D_{md,i,1} & D_{md,i,0} & \cdots & z^{-1}D_{md,i,2} \\ \vdots & \vdots & \ddots & \vdots \\ D_{md,i,M-1} & D_{md,i,M-2} & \cdots & D_{md,i,0} \end{bmatrix}$$

where $D_{md,i,j}$, $i=1, \ldots, M-1$, $j=0, \ldots, M-1$, denote the modulated signals created by modulator 212 from the compensated signal. Although modulator 212 can be realized by the complex frequency shift matrix, a Hadamard transform of order M can be used in an embodiment due to its simple hardware realization. Like the single-rate approach, the modulated signals are applied to the PAF filters as inputs. Therefore, the PAF filters receive the modulated signals through the input matrices $IM_i$ of the size $M \times M-1$, $i=1, \ldots, M-1$, as their inputs. Multiplying each row of the input matrix, $IM_i$, by the polyphase element vector, $PE_i$, defines a unique FIR filter within a PAF filter. Each FIR filter, within a PAF filter, has all the elements $PE_{i,j}$, $j=0, \ldots, M-1$, but the order of the elements in each FIR filter is different. Unlike prior art digital methods, PAF 211 and modulator 212 are in feedback loops. This architecture does not introduce any delay between the output of the sub-ADCs, $\{o_{ds,0}, \ldots, o_{ds,M-1}\}$, and the compensated outputs of system 210, $\{d_0, \ldots, d_{M-1}\}$.

Figure 9:
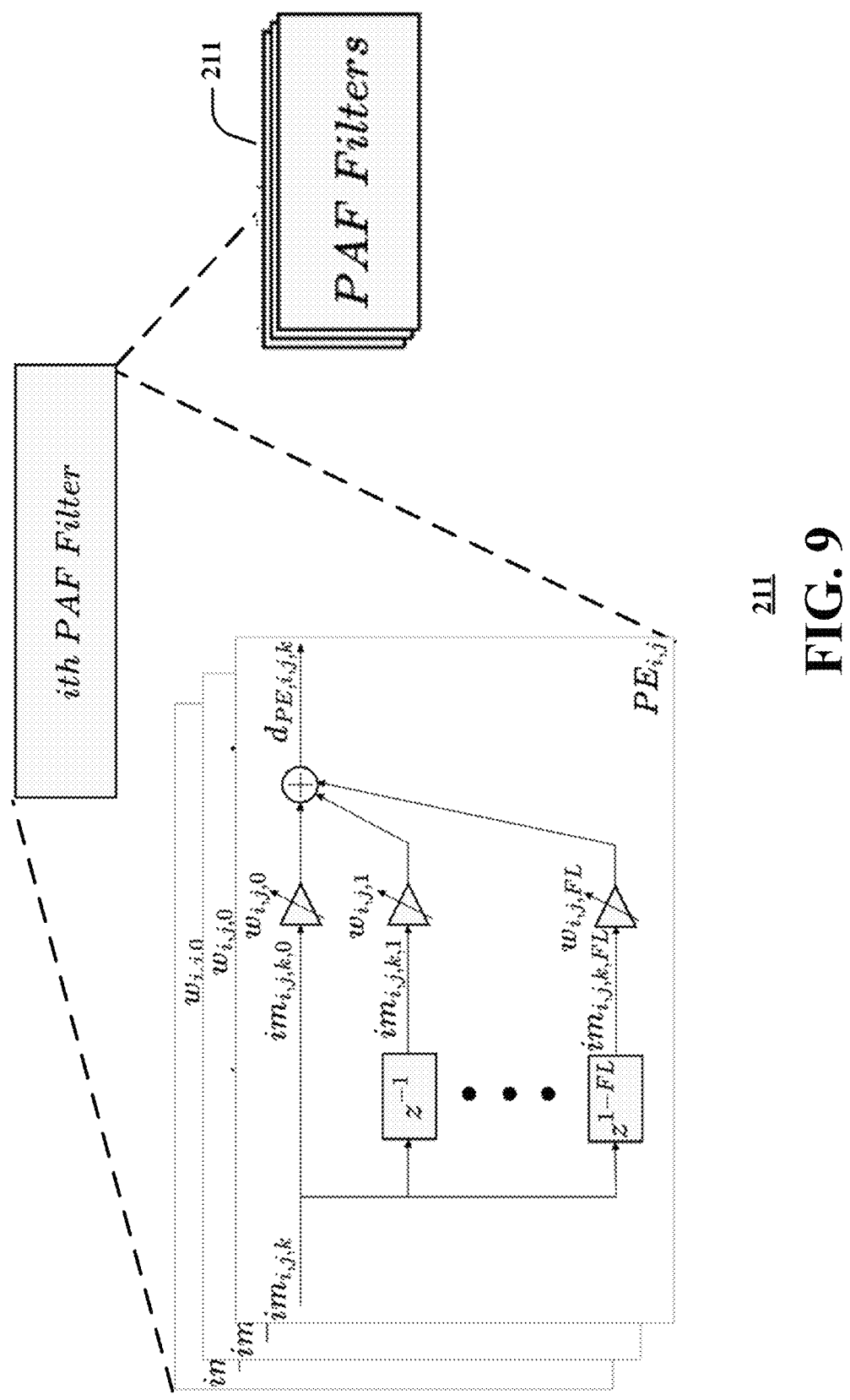
FIG. 9 is a block diagram illustrating an exemplary, non-limiting embodiment of a filter in a bank of polyphase adaptive filters used in a system to digitally compensate for timing skew errors in a time-interleaved analog to digital converter in accordance with various aspects described herein.

FIG. 9 is a block diagram illustrating an exemplary, non-limiting embodiment of a filter in a bank of polyphase adaptive filters used in a system to digitally compensate for timing skew errors in a time-interleaved analog to digital converter in accordance with various aspects described herein. As shown in FIG. 9, PAF 211 remove the error terms for generating the compensated vector signal, $D_{cp}$. In the $i^{th}$ PAF filter, where $i=1, \ldots, M$, a LMS machine iteratively adjusts the weights $\{w_{i,j,0} \ldots w_{i,j,FL}\}$ of the polyphase elements, $PE_{i,j}$, where $j=0, \ldots, M-1$. In the $i^{th}$ PAF filter, each element engages all the M FIR filters while acquiring M different inputs from the matrix $IM_i$. All the inputs and outputs of the polyphase elements must contribute to the gradual adjustments of the weighting coefficients. In the $i^{th}$ PAF filter, the energy signal associated with the $j^{th}$ polyphase element is thus defined as:

$$\xi_{cp,PE_{i,j}} = \sum_{k=0}^{M-1} E\left(d^2_{PE_{i,j,k}}\right), \quad j = 0, \ldots, M-1$$

where $d_{PE_{i,j,k}}$ stands for the outputs of the $j^{th}$ polyphase element receiving, from the matrix $IM_i$, its $k^{th}$ input $im_{i,j,k}$.

Figure 10:
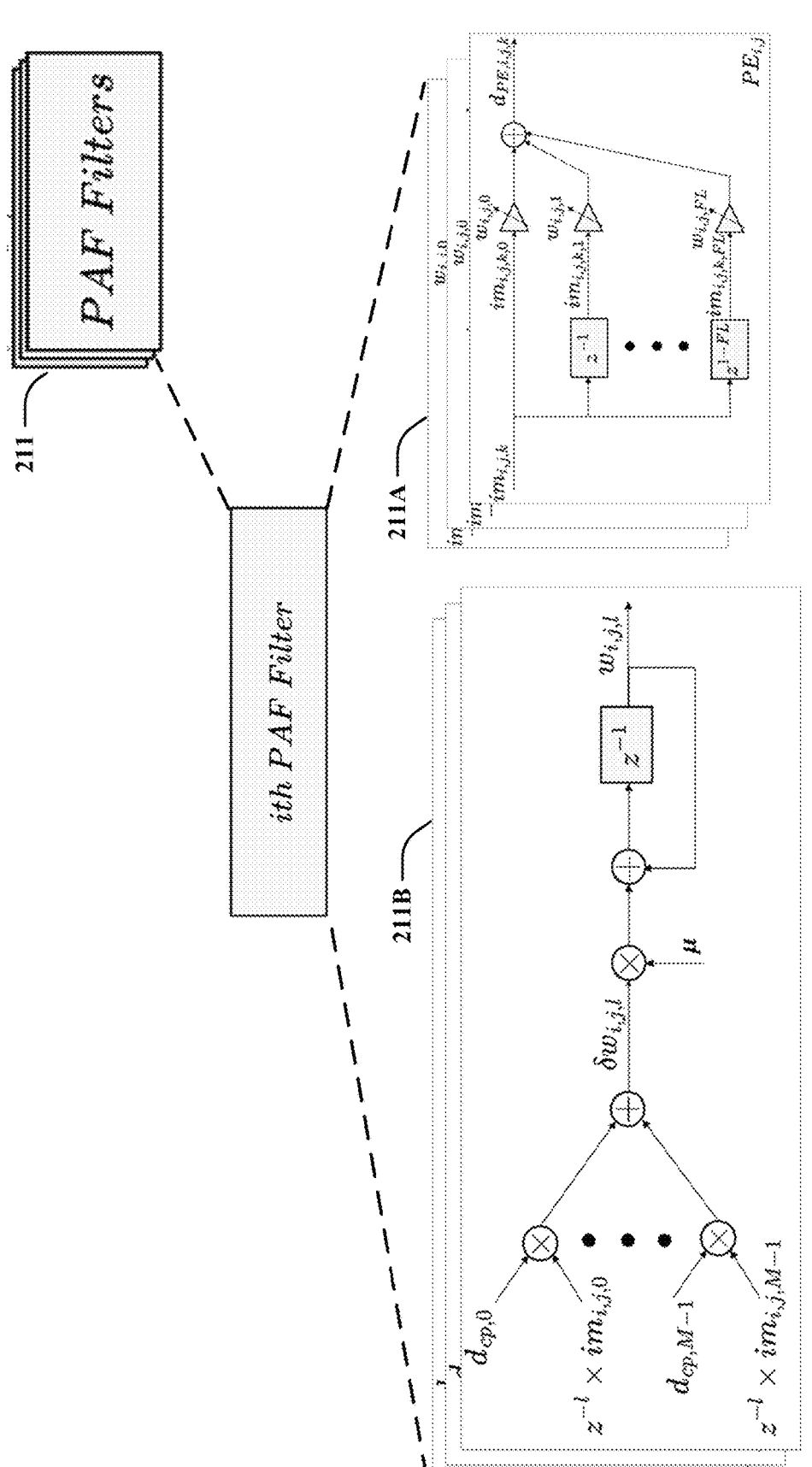
FIG. 10 is a block diagram illustrating an exemplary, non-limiting embodiment of least-mean squared circuits used to create coefficients for tuning polyphase filters in a system to digitally compensate for timing skew errors in a time-interleaved analog to digital converter in accordance with various aspects described herein.

FIG. 10 is a block diagram illustrating an exemplary, non-limiting embodiment of least-mean squared circuits used to create coefficients for tuning polyphase filters in a system to digitally compensate for timing skew errors in a time-interleaved analog to digital converter in accordance with various aspects described herein. As shown in FIG. 10, the LMS circuits 211B create the weighting coefficients for each of the polyphase elements 211A, $PE_{i,j}$, of the $i^{th}$ PAF filter. The LMS algorithm defines the update steps of the weights as:

$$\delta w_{i,j,l}(m) = \frac{d\xi_{cp,PE_{i,j}}}{dw_{i,j,l}},$$

for $i=1, \ldots, M-1$, $j=0, \ldots, M-1$, and $l=1, \ldots, FL$. The update steps can be represented as:

$$\delta w_{i,j,l}(m) = \sum_{k=0}^{M-1} im_{i,j,k}(m-l) \times d_{cp,k}(m).$$

Moreover, the update equations adjusting the jth FIR filter, inside the ith PAF filter, are given by:

$$w_{i,j,l}(m+1) = w_{i,j,l}(m) + \mu \times \delta w_{i,j,l}(m)$$

where $\mu$ denotes the update rate. This parameter ensures the PAF filters' stability as with the single rate format expressed above. The operation rate of the PAF filters is thus $1/M^{th}$ of the TIADC sampling rate (the same as the operating rate of the sub-ADCs). Therefore, the polyphase implementation exhibits almost the same dynamic power dissipation as its single-rate structure. The value of the factor $\mu$ must be determined carefully to ensure stability while providing a good convergence speed of the polyphase filters similar to the single-rate counterpart. Eventually, the number of taps for the PAF filters must be specified according to the required bandwidth and the number of sub-ADCs as is the case with the single-rate version.

To test the design, several simulations using MATLAB/Simulink, Vivado Design Suite, and FPGA designs derived from the functional models are used to verify and evaluate the performance and applicability. A behavioral model used for the TIADC consisting of four identical 12-bit SADCs, and in this model, the sampling rate of TIADC, $F_s$, is normalized to one. Also, the standard deviation of the timing-skew mismatch is set to 0.1 (i.e., 10% of the TIADC's sampling interval). The update rate factor, $\mu$, is set to $2^{-12}$ to ensure the convergence. The length of the polyphase filters, FL, is set to 10.

In these simulations, Fast Fourier Transforms (FFTs) of size $N_{fft}$ measure and evaluate the performance of the proposed technique. Input signals comprising $N_{fft}$ samples are applied to the TIADC to avoid spectral leakage. The frequency of the input tones, $F_{in}$, is translated to the bin index of $I_{bin}$ in FFTs as $F_s \times I_{bin}/N_{fft}$. The input tone frequency specified by $I_{bin}$ is used in all the simulations. Notably, $I_{bin}$ values are selected as prime numbers to avoid repetitive patterns in the input tone(s) and to make the TIADC quantization errors spectrum uniform. For all the simulations, $N_{fft}$ is set to $2^{B+1}$ $(=2^{13})$.

First, the impact of word width on the performance of the proposed technique is evaluated to select the optimum word width in terms of the signal-to-noise-and-distortion ratio (SNDR) and hardware expense. A single-tone sine wave with its associated $I_{bin}$ is selected as the input signal. Corresponding to each word width, 563 simulation runs are performed by sequentially selecting prime numbers in the range $\{1, \ldots, N_{fft}/2\}$ as $I_{bin}$, and the SNDRs are collected to calculate the mean of SNDRs. Table I shows the results with different word widths:

TABLE I

| IMPACT OF WORD WIDTH | | | | | |
| --- | --- | --- | --- | --- | --- |
| Word Width (bits) | 14 | 15 | 16 | 17 | 18 |
| Mean$_{SNDR}$ (dB) | 63.93 | 67.01 | 68.69 | 69.27 | 69.45 |
| $\sigma_{SNDR}$ (dB) | 3.62 | 4.08 | 4.85 | 4.84 | 4.7 |

In the following simulations, our technique is implemented on an FPGA to verify the synthesizability of the Simulink model, evaluate the hardware requirement of the proposed technique, and compare the results from the Simulink fixed-point model and FPGA. The Xilinx Virtex-7 VX690T realized on 28-nm technology is utilized for implementations. The VX690T series of Xilinx Virtex-7 includes 2800 digital signal processing (DSP) slices and 485k logic cells. The Simulink fixed-point model of the proposed technique is first converted to Verilog HDL codes by the Simulink HDL Coder. Then, MATLAB FIL Wizard and Vivado Design Suite synthesize and implement these codes on FPGA. Table II depicts the hardware cost of FPGA implementation corresponding to different word widths:

TABLE II

| HARDWARE COST | | | | | |
| --- | --- | --- | --- | --- | --- |
| Word Width (bits) | 14 | 15 | 16 | 17 | 18 |
| Lookup Tables (%) | 4.15 | 4.35 | 4.29 | 4.78 | 5.04 |
| Flip Flops (%) | 0.41 | 0.42 | 0.44 | 0.46 | 0.47 |
| DSP Slices (%) | 15 | 15 | 15 | 15 | 15 |

As reported in Table I, the SNDR mean improves when the word width grows from 14 to 16 bits. However, the SNDR shows negligible improvement beyond 16 bits. The hardware and power consumption expenses expand with extending word width as depicted in Table II. Therefore, a 16-bit word width is adopted to provide a good trade-off between the SNDR performance and hardware cost.

Figure 11A:
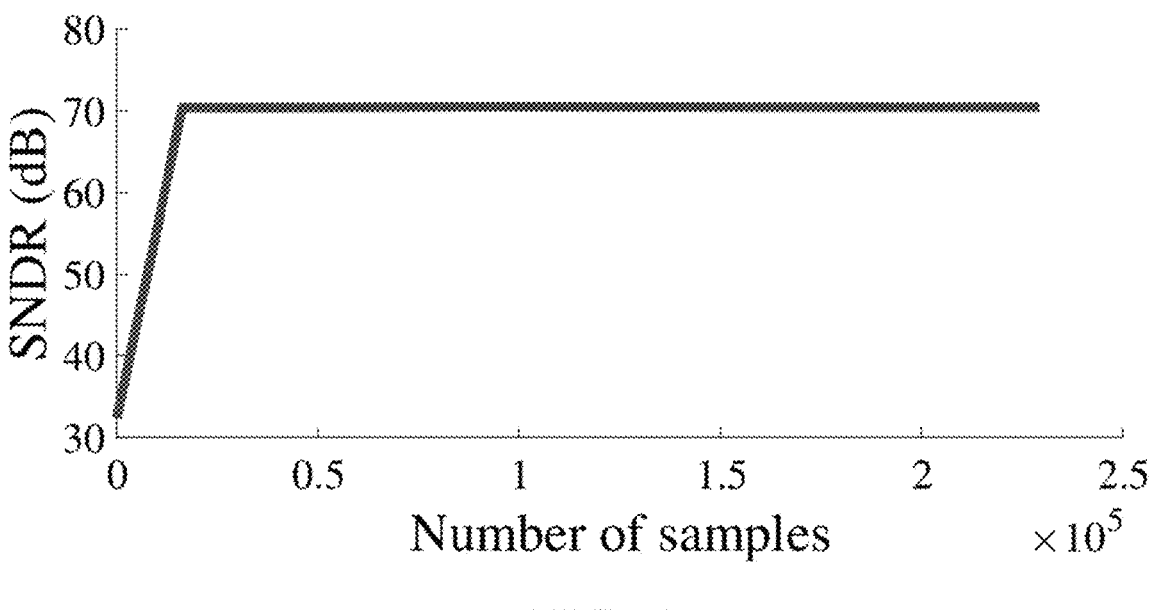
FIGS. 11A and 11B are graphs that illustrate the convergence performance of the system when introduced to a single-tone sine wave.
Figure 11B:
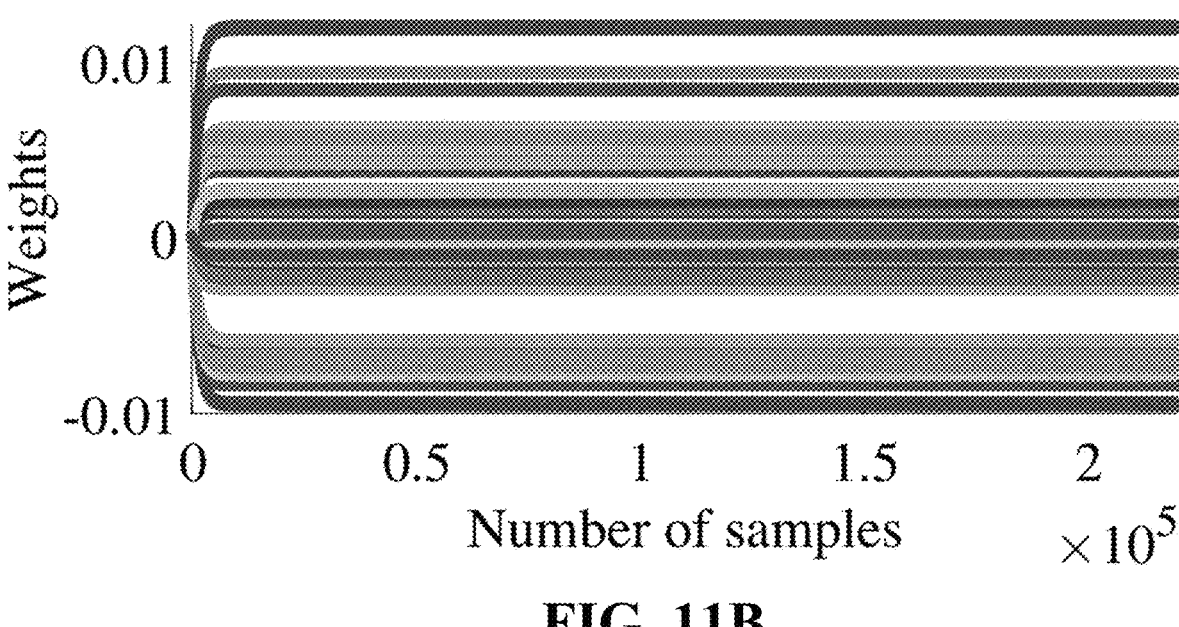

FIGS. 11A and 11B are graphs that illustrate the convergence performance of the system when introduced to a single-tone sine wave. In this simulation, a single-tone sine wave is used as the input signal of the TIADC with its associated bin index $I_{bin}$=2781. Almost all harmonics in the TIADC digital output are significantly attenuated in the compensated signal. FIG. 11A illustrates the convergence of SNDR. The proposed approach enhances the SNDR from 22.57 dB to 70.5 dB. FIG. 11B illustrates the convergence of weights in PAF 211. The method converges with 30k samples and remains stable after convergence. As evident from FIGS. 11A and 11B, the results of the fixed-point Simulink model and the FPGA implementation of the proposed method entirely match validating the synthesizability of the Simulink model with fixed point precision.

Figures 12A, 12B:
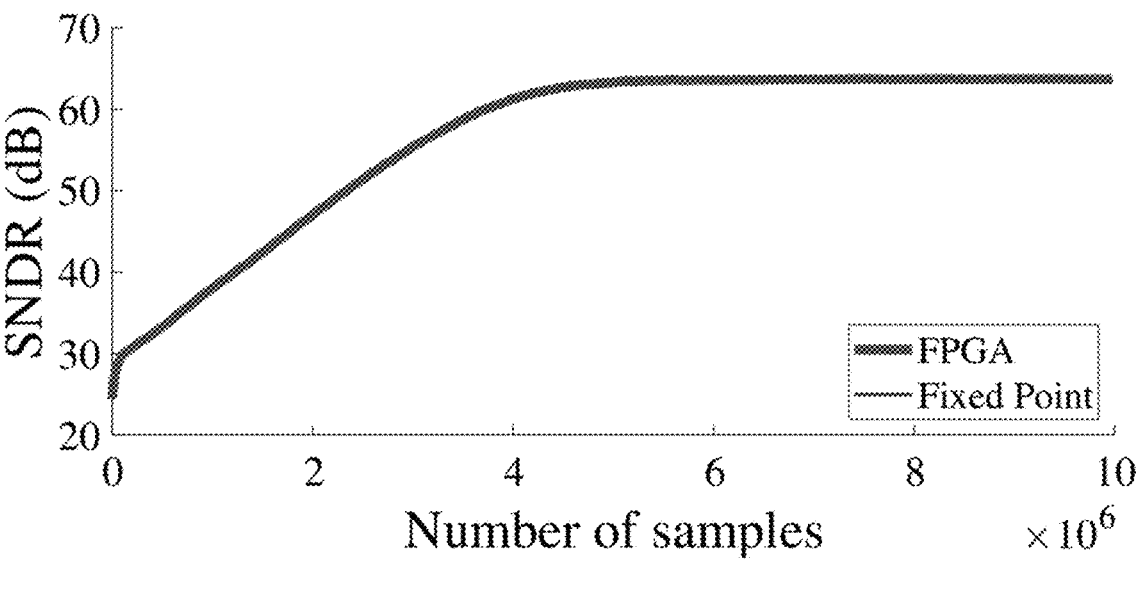
FIGS. 12A and 12B are graphs that illustrate the convergence performance of the system when introduced to an 8-tone sine wave.

FIGS. 12A and 12B are graphs that illustrate the convergence performance of the system when introduced to an 8-tone sine wave. In this simulation, an 8-tone sinewave input signal with its corresponding bins $I_{bin}$={166, 404, 642, 1117, 1355, 1592, 1830} is evaluated is applied to the TIADC modeled in Simulink, together with the FPGA implementation and the fixed-point Simulink model of the proposed method. FIG. 12A indicates the proposed approach enhances the SNDR from 24.32 dB to 63.74 dB. FIG. 12B illustrates the convergence of weights in PAF 211. The method converges after utilizing approximately $4 \times 10^6$ samples. As evident from FIGS. 12A and 12B, the results of the fixed-point Simulink model and the FPGA implementation of the proposed method entirely match again validating the synthesizability of the Simulink model as a fixed-point precision implementation.

Figure 13:
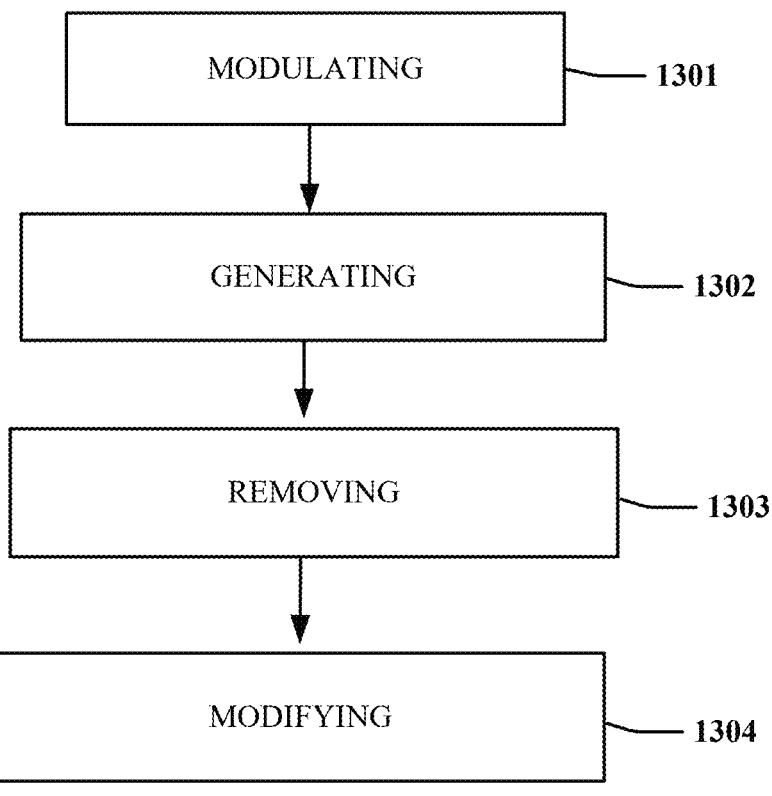
FIG. 13 depicts an illustrative embodiment of a method in accordance with various aspects described herein.

FIG. 13 depicts an illustrative embodiment of a method in accordance with various aspects described herein. As shown in FIG. 13, method 1300 begins at step 1301 where a digital timing skew compensator modulates a compensated signal at the output of the compensator to create a modulated signal. Next in step 1302, the modulated signal is supplied to an adaptive filter bank. The adaptive filter bank, which is disposed in a feedback loop, generates an error signal. Next in step 1303, the compensator subtracts the error signal from an input signal generated by a time interleaved analog to digital converter to create the compensated signal. Finally, in step 1304, the compensator modifies coefficients of the adaptive filter bank to reduce the energy found in the error signal.

While for purposes of simplicity of explanation, the respective processes are shown and described as a series of blocks in FIG. 13, it is to be understood and appreciated that the claimed subject matter is not limited by the order of the blocks, as some blocks may occur in different orders and/or concurrently with other blocks from what is depicted and described herein. For example, in an embodiment, the modulated signal may be generated from the input signal generated by the time interleaved analog to digital converter. In another embodiment, the adaptive filter bank comprises a polyphase filter bank including plural adaptive finite impulse response filters. In another embodiment, the modulator comprises a Hadamard matrix. Moreover, not all illustrated blocks may be required to implement the methods described herein.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data. Computer-readable storage media can comprise the widest variety of storage media including tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit clements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A digital timing skew compensator, comprising:
a first polyphase adaptive filter bank having a first input and a first output;
a first input matrix coupled to the first input of the first polyphase adaptive filter bank;
a first subtractor coupled to the first output of the first polyphase adaptive filter bank, wherein the first subtractor removes a first signal generated by the first polyphase adaptive filter bank from digital outputs of sub analog-to-digital converters (ADCs) of a time-interleaved ADC to create a desired signal, wherein the desired signal is coupled to the first input matrix;
a modulation matrix that modulates the digital outputs of the sub-ADCs to create a modulated signal vector;
a second polyphase adaptive filter bank having a second input and a second output;
a second input matrix coupled to the second input of the second polyphase adaptive filter bank; and
a second subtractor coupled to the second output of the second polyphase adaptive filter bank, wherein the second subtractor removes a second signal generated by the second polyphase adaptive filter bank from the modulated signal vector to create an error signal, wherein the error signal is coupled to the second input matrix.

2. The digital timing skew compensator of claim 1, wherein the modulation matrix processes complex signals by complex frequency shift operations.

3. The digital timing skew compensator of claim 1, wherein the modulation matrix comprises a Hadamard transform.

4. The digital timing skew compensator of claim 1, wherein each of the first polyphase adaptive filter bank and the second polyphase adaptive filter bank comprise a first number of adaptive finite impulse response filters, wherein the first number equals a second number of sub-ADCs in the time-interleaved ADC.

5. The digital timing skew compensator of claim 4, wherein each adaptive finite impulse response filter of the first polyphase adaptive filter bank receives all polyphase components that are generated from a third output of the first input matrix and each adaptive finite impulse response filter of the second polyphase adaptive filter bank receives all polyphase components that are generated from a fourth output of the second input matrix.

6. The digital timing skew compensator of claim 5, wherein an ordering is different for each of the polyphase components in each adaptive finite impulse response filter.

7. The digital timing skew compensator of claim 5, further comprising a first least-mean squared circuit for tuning first coefficients of the first polyphase adaptive filter bank and a second least-mean squared circuit for tuning second coefficients of the second polyphase adaptive filter bank.

8. The digital timing skew compensator of claim 7, wherein the first least-mean squared circuit and the second least-mean squared circuit reduce energy signals of each of the polyphase components.

9. The digital timing skew compensator of claim 8, wherein the first least-mean squared circuit and the second least-mean squared circuit each comprise a parameter to stabilize the first polyphase adaptive filter bank and the second polyphase adaptive filter bank, respectively.

10. The digital timing skew compensator of claim 1, wherein the digital timing skew compensator is implemented in a field-programmable gate array.

11. The digital timing skew compensator of claim 1, wherein the digital timing skew compensator is implemented in an application specific integrated circuit.

12. A digital timing skew compensator, comprising:
an adaptive filter bank having a first input and a first output;
a first subtractor coupled to the first output of the adaptive filter bank, wherein the first subtractor removes a reconstructed error component generated by the adaptive filter bank from a digital output of a time-interleaved analog-to-digital converter (ADC) to create a compensated signal; and a modulator that modulates the compensated signal to create a modulated signal vector, wherein the modulated signal vector is coupled to the first input of the adaptive filter bank.

13. The digital timing skew compensator of claim 12, wherein the modulator processes complex signals by complex frequency shift operations.

14. The digital timing skew compensator of claim 12, wherein the modulator comprises a Hadamard transform.

15. The digital timing skew compensator of claim 12, wherein the adaptive filter bank comprises a first number of adaptive finite impulse response filters, wherein the first number is one less than a second number of sub-ADCs in the time-interleaved ADC.

16. The digital timing skew compensator of claim 15, further comprising a least-mean squared circuit that adjusts weights of each of the adaptive finite impulse response filters to minimize energy signals of each component of the compensated signal.

17. The digital timing skew compensator of claim 16, wherein the least-mean squared circuit comprises a parameter to stabilize the adaptive finite impulse response filters.

18. The digital timing skew compensator of claim 12, wherein the adaptive filter bank comprises polyphase adaptive filters, wherein each polyphase adaptive filter comprises a bank of impulse response filters.

19. A digital timing skew compensator, comprising:

an input to receive a digital signal from either a time-interleaved analog-to-digital converter (ADC) or a plurality of sub-ADCs, wherein the time-interleaved ADC comprises the plurality of sub-ADCs;

a first output to provide a compensated digital signal;

a feedback path between the first output and the input having an adaptive filter bank disposed in the feedback path; and a subtractor that removes a second output of the adaptive filter bank from the input to generate the compensated digital signal.

20. The digital timing skew compensator of claim 19, further comprising a modulator disposed in the feedback path that receives the compensated digital signal from the first output and provides a modulated signal to the adaptive filter bank.

\* \* \* \* \*